United States Patent
Brunner et al.

(10) Patent No.: US 7,939,996 B2
(45) Date of Patent: *May 10, 2011

(54) DISPLAY DEVICE WITH SOLID STATE FLUORESCENT MATERIAL

(75) Inventors: Klemens Brunner, Eindhoven (NL); Aldegonda Lucia Weijers, Eindhoven (NL); Hans-Peter Stormberg, Stolberg (DE); Guido Henri Maria Van Tartwijk, Shanghai (CN); Jean Paul Jacobs, Eindhoven (NL); Hans-Helmut Bechtel, Roetgen (DE); Egbert Lenderink, Eindhoven (NL); Lingli Wang, Eindhoven (NL); Marco Van As, Eindhoven (NL); Erik Boonekamp, Eindhoven (NL); Martinus Petrus Joseph Peeters, Eindhoven (NL); Oscar Arturo Chao Pujol, Eindhoven (NL); Martijn Henri Richard Lankhorst, Eindhoven (NL); Teunis Willem Tukker, Eindhoven (NL); Cornelis Jojakim Jalink, Eindhoven (NL); Peter Alexander Duine, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 169 days.

This patent is subject to a terminal disclaimer.

(21) Appl. No.: 12/094,673

(22) PCT Filed: Nov. 14, 2006

(86) PCT No.: PCT/IB2006/054236
§ 371 (c)(1),
(2), (4) Date: May 22, 2008

(87) PCT Pub. No.: WO2007/060573
PCT Pub. Date: May 31, 2007

(65) Prior Publication Data
US 2008/0303407 A1 Dec. 11, 2008

(30) Foreign Application Priority Data

Nov. 24, 2005 (EP) .................................. 05111202

(51) Int. Cl.
*H01J 1/62* (2006.01)
(52) U.S. Cl. ........ 313/496; 313/484; 313/485; 313/486; 313/487
(58) Field of Classification Search .......... 313/484–487, 313/489, 498, 512, 467, 468, 499, 501–503; 257/98–100, 79–81; 362/235, 227, 231, 362/293, 545, 800; 345/44, 46; 438/22, 438/26, 458
See application file for complete search history.

(56) References Cited

U.S. PATENT DOCUMENTS 6,255,670 B1 7/2001 Srivastava et al.
(Continued)

FOREIGN PATENT DOCUMENTS

EP 1363335 A2 11/2003
(Continued)

OTHER PUBLICATIONS

MacAdam, D.: "Visual Sensitivities to Color Differences in Daylight"; Journal of the Optical Society of America, vol. 32, No. 5, May 1942, pp. 247-274.
(Continued)

*Primary Examiner* — Bumsuk Won
*Assistant Examiner* — Elmito Breval

(57) ABSTRACT

A display device (100) comprising a plurality of lighting units (101), each lighting unit comprising at least one light emitting diode (202) being provided with a fluorescent element (203) arranged to absorb at least part of the light emitted by said light emitting diode and emit light of a wavelength range different from that of the absorbed light is provided. The fluorescent element (203) comprises at least one phosphor being an europium(II)-activated halogeno-oxonitridosilicate of the general formula $Ea_xSi_yN_{2/3x+4/3y}:Eu_zO_aX_b$.

11 Claims, 1 Drawing Sheet

U.S. PATENT DOCUMENTS

| | | | |
|---|---|---|---|
| 7,332,746 B1 * | 2/2008 | Takahashi et al. | 257/98 |
| 2002/0113246 A1 * | 8/2002 | Nagai et al. | 257/99 |
| 2004/0000868 A1 | 1/2004 | Shimizu et al. | |

FOREIGN PATENT DOCUMENTS

| | | |
|---|---|---|
| EP | 1403355 A1 | 3/2004 |
| EP | 1566848 A2 | 8/2005 |
| JP | 2004080058 A | 3/2004 |
| WO | WO2004040661 A2 | 5/2004 |

OTHER PUBLICATIONS

MacAdam, D.: "Color Measurement-Theme and Variation"; Springer-Verlag Publishers, 1981, Chapter 1, pp. 1-25.

* cited by examiner

DISPLAY DEVICE WITH SOLID STATE FLUORESCENT MATERIAL

The present invention relates to a display device comprising a plurality of lighting units, each lighting unit comprising at least one light emitting diode being provided with a fluorescent element arranged to absorb at least part of the light emitted by said at least one light emitting diode and emit light of a wavelength range different from that of the absorbed light.

Recently, various attempts have been made to make white light emitting illumination systems by using light emitting diodes (LEDs) as radiation sources.

In many applications, such as for example when LED-based display devices are used in backlight units for LCD display devices, the aim of the LED-device is to offer a homogenously illuminated area. This illuminated area preferably has a high color homogeneity and brightness homogeneity. Usually, accurately tuning of the color and flux of the LEDs is needed in production. To keep the homogeneity during lifetime of the product, sensors and feedback control need to be built in to ensure performance.

LEDs are monochromatic light sources. There are several ways to achieve white emission needed for some applications.

A dichromatic approach to achieve white emission from a monochromatic blue light source is the partial conversion of a blue LED emission into yellow/orange light, by use of a yellow emitting phosphor. The combined emission of the non-converted blue LED emission and the yellow/orange-converted light gives a white impression.

One problem with providing the desired color homogeneity is the so-called binning problem. Not all LEDs of a certain type emit the same wavelength spectrum. Thus, after production of LEDs of a certain type, the LEDs are typically sold in so called bins. The LEDs are binned according to their dominant wavelength or peak wavelength. This is a measure for the spectral content of the emitted light. In a bin, all LEDs have a dominant or peak wavelength within a certain range. A typical range for a bin is for example 5 nm. If the LEDs are not carefully selected from the bins, unwanted color variation over the screen will appear.

For white LEDs, the bins are characterized by the CCT (Correlated Color Temperature) of the LEDs and the distance to the black body line. If a backlight has white LEDs with different CCTs, or if the distance of the LED emission to the black body line varies for a given CCT, it will give an unwanted color variation over the backlight.

In another approach, several LEDs of different colors, for example the colors red, green and blue, can be combined in one package so that the red, green and blue emission is mixed and a white impression is achieved. Such a package can be realized with three different types of LEDs: one type of LED provides the green light, another one the red light and yet another one the blue light.

LED-based display devices typically comprise a plurality of independently addressable diodes. The diodes are grouped into pixels, typically consisting of one red, one green and one blue emitting diode (RGB-display). Each pixel in such a display device may produce virtually any color, including white light, in a color range determined by the color coordinates of the LEDs in the pixel.

One could use the InGaN materials systems to provide the colors green and blue and the AlInGaP material system to provide the color red. This approach has the disadvantage that the different material systems have different characteristics regarding e.g. temperature and ageing.

Instead, the same semiconductor material (e.g. InGaN) is used for all LEDs in such a package, for example emitting blue light, and the green and red diodes are provided by blue LEDs with green and red phosphors, respectively.

However, as the total light from the phosphor provided LEDs is a combination of the blue light from the LED and the phosphor emitted light, the binning problem is also a factor here, and LEDs from different bins will in the end give light of different color coordinates. Thus, also for such an RGB-display, the binning problem will lead to an undesired color variation in a display device.

One dichromatic approach as discussed above is disclosed in European Patent Application no 1 363 335 A2, to Sumimoto Electric Industries Ltd, describing a blue light emitting diode of an InGaN semiconductor combined with a fluorescence plate of $ZnS_xSe_{1-x}$ doped with Al, In, Ga, Br or I ($0.2 \leq x \leq 0.7$) for absorbing blue light and emitting yellow light. The blue light not absorbed by the fluorescence plate and the yellow light emitted by the fluorescence plate mixes into a white light.

However, EP 1 363 335 A2 does not provide any solution to the binning problem. Thus, a display device, such as a white light backlight based on the diode/fluorescence plate assemblies of EP 1 363 335 A2, will still suffer from the binning problem. If blue LEDs from different bins are to be used in such a backlight, an undesired color variation will appear over the back light.

This gives that in order to obtain a display device without the undesired color variations, the LEDs must be selected from within the same bin, and even to that LEDs of some bins are not at all suited for use in display devices, as the dominant wavelength is to far from the desired.

Thus, there exists a need for a display device, which may use LEDs from different bins without giving undesired color variation.

It is a first object of the present invention to fulfill these above-mentioned needs and to provide a LED based display device exhibiting high color homogeneity and high stability for dichromatic white light generation.

The present invention is based on the fact that finding that the color of a phosphor converted LED may be tuned, i.e. adjusted to a desired wavelength profile, color temperature, color coordinate, etc, by varying the thickness of the fluorescent material containing the phosphor or the composition of phosphor system.

The present inventors have found that a fluorescent material suitable for use in such a LED based display device is a fluorescent material comprising at least one phosphor being an europium(II)-activated halogeno-oxonitridosilicate of the general formula $Ea_xSi_yN_{2/3x+4/3y}:Eu_zO_aX_b$, wherein: $1 \leq x \leq 2$; $3 \leq y \leq 7$; $0.001 < z \leq 0.09$, $0.005 < a \leq 0.05$, $0.01 < b \leq 0.3$; wherein Ea is at least one earth alkaline metal chosen from the group of calcium, barium and strontium; and X is at least one halogen chosen from the group of fluorine, chlorine, bromine and iodine.

These europium(II)-activated halogeno-oxonitridosilicate are very stable over time. Thus, the variations of an LED being provided with a fluorescent material based on such a phosphor will essentially only be due to the LED it self, not the fluorescent material.

Thus, in a first aspect, the present invention provides a display device comprising a plurality of lighting units, typically independently addressable, each lighting unit comprising at least one light emitting diode being provided with a fluorescent element arranged to absorb at least part of the light emitted by said light emitting diode and emit light of a wavelength range different from that of the absorbed light. In a device of the present invention, said fluorescent element comprising at least one phosphor being an europium(II)-activated halogeno-oxonitridosilicate of the general formula $Ea_xSi_yN_{2/3x+4/3y}$:$Eu_zO_aX_b$, wherein $1 \leq x \leq 2$; $3 \leq y \leq 7$; $0.001 < z \leq 0.09$, $0.005 < a \leq 0.05$, $0.01 < b \leq 0.3$; Ea is at least one earth alkaline metal chosen from the group of calcium, barium and strontium; and X is at least one halogen chosen from the group of fluorine, chlorine, bromine and iodine.

As mentioned above, this europium(II)-activated halogeno-oxonitridosilicate phosphor material is very stable, and is thus, well suited for use in a LED-based display device of the invention.

In embodiments of the present invention, the fluorescent element is a solid state element, such as for example a ceramic material comprising the at least one phosphor or a polymeric material comprising particles of the at least one phosphor dispersed in a polymer matrix.

A fluorescent element comprising the europium(II)-activated halogeno-oxonitridosilicate phosphor material may easily be formulated into a solid state element.

The thickness of such a solid-state fluorescent element can be controlled with very high accuracy, and are thus very advantageous to use in a display device of the present invention.

In a preferred embodiment, a display device of the present invention comprises at least a first diode emitting light of a first color, for example selected from a first bin, being provided with a first fluorescent element and at least a second diode emitting light of a second color, for example selected from a second bin, being provided with a second fluorescent element. In such an embodiment, the first fluorescent element is of a first thickness, and the second fluorescent element is of a second thickness, such that said first and second light emitting diodes provides total light of essentially the same color.

One advantage of this embodiment is that a display device may be assembled using LEDs emitting different colors, typically LEDs comprising the same semiconductor material but being selected from different bins, but by carefully selecting the thickness of the fluorescent element to be provided on each LED according to the color (bin) of that particular LED, the color of total light, i.e. the combination of light emitted by the LED and the light emitted by the fluorescent element, may still be perceived essentially as the same color by a viewer. Thus, a homogenous light may be achieved even though LEDs emitting light of different colors (selected from different bins) are used.

In embodiments of the present invention, the fluorescent elements may further comprise at least one additional phosphor Such additional phosphors may for example be selected from the group consisting of:
  blue phosphors comprised in the group consisting of $BaMgAl_{10}O_{17}$:Eu, $Ba_5SiO_4(Cl,Br)_6$:Eu, $CaLn_2S_4$:Ce, $(Sr,Ba,Ca)_5(PO_4)_3Cl$:Eu and $LaSi_3N_5$:Ce;
  red phosphors comprised in the group consisting of $(Ca_{1-x}Sr_x)S$:Eu, wherein $0 \leq x \leq 1$ and $(Sr_{1-x-y}Ba_xCa_y)_{2-z}Si_{5-a}Al_aN_{8-a}O_a$:$Eu_z$, wherein $0 \leq a < 5$, $0 < x \leq 1$, $0 \leq y \leq 1$ and $0 < z \leq 0.09$; and
  yellow to green phosphors comprised in the group consisting of $(Ba_{1-x}Sr_x)_2SiO_4$:Eu, wherein $0 \leq x \leq 1$, $SrGa_2S_4$:Eu, $SrSi_2N_2O_2$:Eu, $Ln_3Al_5O_{12}$:Ce and YAG-Ce.

The use of such additional phosphor(s) may increase the color rendition index of the total light produced by the display device and/or may be used to further tune the color of the total light produced by the device.

In embodiments of the present invention, a lighting unit of a display device may comprise at least a first light emitting diode and a second light emitting diode of the same semiconductor material, wherein at least one of said first and second light emitting diodes is provided with a fluorescent element.

Typically, such a lighting unit comprises for example three blue pump LEDs wherein two of the pump LEDs are provided fluorescent elements, such as one green and one red fluorescent element (an RGB-display).

As described above, the total light from a LED provided with a fluorescent element is a combination of the converted and the non-converted light. By carefully selecting the thickness of the fluorescent elements according to the color (bin) of the pump LED, a multi-color display device capable of providing a homogenous light without color variations is possible to achieve, even if the pump-LEDs provided with fluorescent elements emits light of different colors (selected from different bins).

Alternatively, all LEDs in a lighting unit of such a multi-color display device (such as an RGB-display) may be provided with fluorescent elements. For example UV-LEDs may be used as pump-LEDs, and in addition the above, the blue light is provided by a blue fluorescent element. This further reduces the binning problem as also the LEDs providing the blue color (UV-LED with blue fluorescent element) may be LEDs emitting light of different colors (selected from different bins).

In embodiments of the present invention, the fluorescent elements may comprise light scattering portions, such as particles or air bubbles. This may improve the color mixing of light from adjacent light emitting diodes.

In other aspects, the present invention also relates to back light units for use in for example liquid crystal display, which backlight units comprises display devices of the present inventions. The present invention also relate to display devices, such as liquid crystal display devices comprising such back light units.

This and other aspects of the present invention will now be described in more detail, with reference to the appended drawings showing a currently preferred embodiment of the invention.

Figure 1:
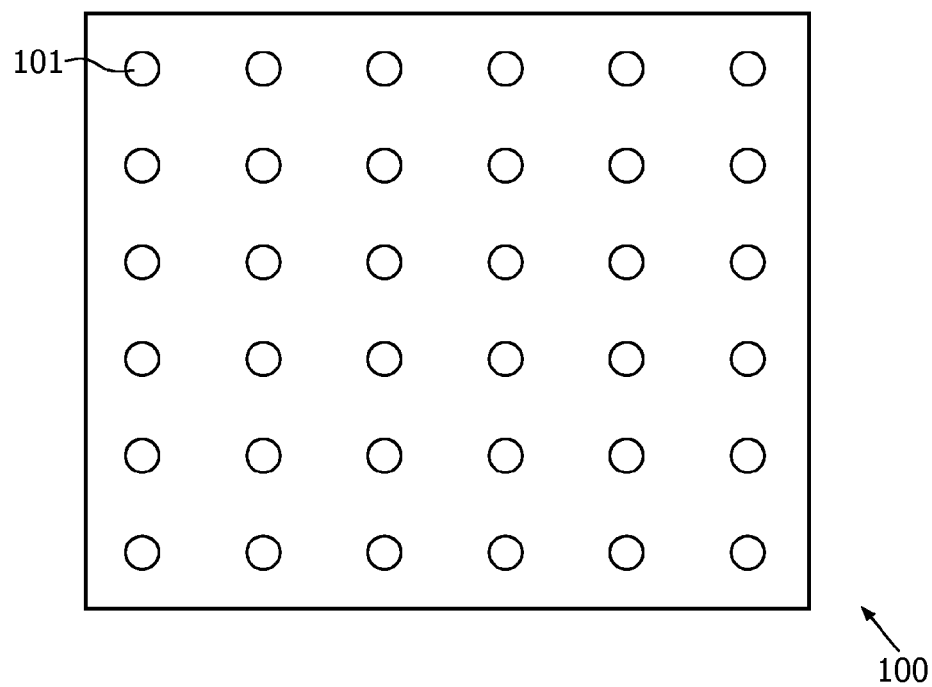
FIG. 1 illustrates an embodiment of a display device of the present invention.

The present invention focuses on the use of a europium(II)-activated halogeno-oxonitridosilicate as a phosphor contained in a solid state fluorescent element provided on light emitting diodes. The fluorescent element used in a display device according to the invention comprises as a phosphor a europium(II)-activated halogeno-oxonitridosilicate. The phosphor conforms to the general formula $Ea_xSi_yN_{2/3x+4/3y}$:$Eu_zO_aX_b$, wherein $1 \leq x \leq 2$; $3 \leq y \leq 7$; $0.001 < z \leq 0.09$, $0.005 < a \leq 0.05$, $0.01 < b \leq 0.3$, Ea is as least one earth alkaline metal chosen from the group comprising calcium, strontium and barium; and X is a least one halogen selected from the group comprising fluorine, chlorine, bromine and iodine.

This class of phosphor material is based on activated luminescence of an oxygen and halogen-substituted nitridosilicate.

The phosphor of the general formula $Ea_xSi_yN_{2/3x+4/3y}$:$Eu_zO_aX_b$, wherein $1 \leq x \leq 2$; $3 \leq y \leq 7$; $0.001 < z \leq 0.09$, $0.005 < a \leq 0.05$, $0.01 < b \leq 0.3$, comprises a host lattice with the main components of silicon and nitrogen.

It also comprises oxygen and a halogen. The host lattice is supposed to have a structure consisting of (N—Si—N—) and (O—Si—N)-units in a three-dimensional network, wherein silicon is tetrahedrically surrounded by nitrogen and oxygen or halogen.

The incorporation of oxygen and halogen in the host lattice increases the proportion of covalent bonding and ligand-field splitting. Consequently, this leads to a shift of excitation and emission bands to longer wavelengths in comparison with the basic nitridosilicate lattices.

Within the three-dimensional network, metal ions such as earth alkaline metals as well as europium(II) and optionally a co-activator are incorporated. Preferably, the earth alkaline metals are selected from calcium, strontium and barium.

The host lattice for those materials may be a six-element (two-cation) halogeno-oxonitridosilicate such as for example europium(II)-activated strontium fluoro-oxonitridosilicate $Sr_2Si_5N_8$:Eu,O,F, or it may comprise more than six elements such as for example europium(II)-activated strontium-calcium fluoro-oxonitridosilicate, e.g. $(Ca,Sr)_2Si_5N_8$:Eu,O,F.

Especially, as co-activators within the basic host lattice, substitution of trivalent rare earth metal ions for divalent earth alkaline metals is possible. When substituting earth alkaline metals Ea with rare earth metals Re, such as samarium and ytterbium, the proportion is preferably within the range of 0.2:0.8 to 0.8:0.2.

The proportion z of europium(II) is preferably in a range of $0.001 < z < 0.09$.

When the proportion z of Eu(II) is 0.001 or lower, luminance decreases because the number of excited emission centers of photoluminescence due to europium(II)-cations decreases, and when the proportion of z is greater than 0.09, density quenching occurs. Density quenching refers to the decrease in emission intensity, which occurs when the concentration of an activation agent added to increase the luminance of the fluorescent material is increased beyond an optimum level.

These europium(II)-activated halogeno-oxonitridosilicate phosphors are responsive to more energetic portions of the electromagnetic spectrum than just the visible portion of the spectrum.

In particular, the phosphors according to the invention are especially excitable by UV emission lines, which have wavelengths in the range of 200 to 420 nm, but are excited with higher efficiency by LED light emitted by a blue light emitting component having a wavelength from 400 to 480 nm. Thus, the fluorescent material has ideal characteristics for converting blue light of nitride semiconductor light emitting components into white light.

The method for producing a europium(II)-activated halogeno-oxonitridosilicate phosphor of the present invention is not particularly restricted, and said europium(II)-activated halogeno-oxonitridosilicate phosphor can be produced by firing a mixture of metal compounds which provides a europium(II)-activated halogeno-oxonitridosilicate fluorescent material.

Especially preferred however is a method of manufacturing these phosphors comprising the steps of a) mixing starting materials from at least one oxygen-containing alkaline earth precursor compound, at least one silicon nitrogen compound selected from the group comprising silicon nitride and silicon diimide, at least one europium halide, selected from the group comprising europium fluoride, europium chloride, europium bromide and europium iodide, and a reducing compound selected from the group comprising carbon and silicon, to prepare a mixture, and b) transferring the resulting mixture into a closed reactor and heat-treating the mixture under a reducing atmosphere of a mixed gas, composed of nitrogen and hydrogen.

Preferably, the oxygen-containing alkaline earth precursor compound is a carbonate, such as $CaCO_3$, $SrCO_3$ and $BaCO_3$.

Starting materials having a high purity of 99.9% or more and in the form of fine particles having an average particle size of 100 nm or less can be preferably used.

In order to augment crystallite size it is possible to incorporate a flux component in the starting material powder. The flux acts as a solvent in the solid-phase reaction and, while it is not reactive with the target oxide, it enhances substance movement by creating a very small amount of melt and enhances the reaction. Conventional fluxes such as alkali metal halides, alkaline earth metal halides, and the like, for example, calcium fluoride, strontium fluoride or barium fluoride, can be used for this purpose. Those compounds are preferably introduced into individual particles of the starting material powder or coated onto the starting material powder.

When the above-mentioned flux components are introduced into the starting material powder, a highly-crystallized oxide powder can be obtained under the same heating conditions due to the effect of the flux as a reaction enhancer. The flux components can be removed by conventional methods, such as washing after the oxide powder has been produced.

In the first place, the starting materials, i.e., at least one oxygen-containing alkaline earth precursor compound, at least one silicon nitrogen compound, at least one europium halide, and a reducing compound are well mixed by a dry and/or wet process utilizing any of various known mixing methods, such as ball mills, V-shaped mixers, stirrers and the like.

Alternatively, at least one oxygen-containing alkaline earth precursor compound and at least one europium precursor compound may be first dissolved in an aqueous solvent. The dissolved precursor compounds may then be dried and calcined to form a powder comprising a europium-doped oxygen-containing alkaline earth precursor compound.

For example, the precipitated powder may comprise (Sr, Ba)$CO_3$:Eu(III), which is then decomposed by decarboxylation in the presence of elemental carbon at a suitable temperature, such as 1000° C., to form (Sr,Ba)O:Eu(III). This powder is then mixed with a powder comprising an earth alkaline metal halide and at least one silicon nitrogen compound, at least one europium halide, and a reducing compound to form a first composite powder mixture. If desired, other starting compounds may also be added to the first composite powder mixture. Furthermore, other combinations of starting materials may also be used, if desired.

For example, hydroxides of the starting materials may be precipitated and then decomposed to form oxides of the starting materials, which are then mixed with AlF 3 to form the blended first powder.

The blended first powder is then fired or sintered in a suitable container for between about 2 and 10 hours at 1000 to 1600° C., preferably for six hours at 1500° C., to form a sintered body or cake. Preferably, the container is an alumina crucible. According to a preferred aspect of the present invention, the alumina crucible is placed into a second container, such as a large crucible or other type of container, which contains a carbon-based fuel, such as activated charcoal. Both containers are then individually covered and placed in a furnace or adjacent to any other suitable heat source and their temperature is raised to 1000 to 1600° C. to evaporate at least a portion of the fuel to produce a weak reducing atmosphere comprising carbon, such as a carbon dioxide and/or carbon monoxide atmosphere. The reducing atmosphere penetrates the first crucible, even if it is covered, thereby enhancing the reduction process. The amount of charcoal is not critical, and may comprise from 10 to 50% of the volume of the second container.

The order of the steps described above may be changed as desired.

The method for mixing the starting materials is generally a ball milling method, however it is not limited to this, and other mixing methods including hand mixing or any form of dry mixing can be applied as long as the method results in homogeneous mixing of starting materials.

The mixture obtained is placed in a heat-resistant container, such as an alumina crucible or a tungsten boat, and then fired in an electric furnace, such as a high frequency furnace or a microwave furnace. Preferably, the heat-treating temperature ranges from 1,300 to 1,700° C.

The firing atmosphere is not particularly restricted, and, for example, it is preferable to conduct firing in a reducing atmosphere, such as an atmosphere comprising inert gas, such as nitrogen and argon and the like, and hydrogen in a proportion of 0.1 to 10 volume %. Carbon may be added to the starting materials as an extra reducing agent. The firing period is determined based on various conditions, such as the amount of the mixture charged in the container, the firing temperature and the temperature at which the product is taken out of the furnace, but generally, it will be in the range of 6 to 14 hours.

Fluorescent material obtained by the above-mentioned method may be ground by using, for example, a ball mill, jet mill and the like. Moreover, washing and classification may be conducted. For further enhancing the crystalline properties of the resulting granular phosphor, re-firing is suggested.

For example, one of the preferable compounds represented by $Sr_2Si_5N_8$:Eu,O,F is produced by the method where strontium carbonate, carbon, silicon diimide and europium(III) fluoride as the starting materials are weighed and compounded to obtain a molar ratio of Sr:Si:N:O:F:Eu of 2:2:5:8:0.05:0.27:0.09, and are then fired.

The heat-treating process in the present invention should be undertaken under a reducing atmosphere comprised of nitrogen and hydrogen, wherein Eu(III) is reduced to Eu(II).

In the heat-treating process of the present invention, the temperature of the heat treatment ranges from 1,300 to 1,700° C. When the heat-treating temperature is below 1,300° C., the required complete solid state reaction does not take place, or the resulting particle size of the phosphor is too small; whereas when the reaction temperature is above 1,700° C., in spite of the completeness of the reaction, the resulting particle size of the phosphor is too large to be applicable in LEDs.

The most preferable temperature of the heat-treating process ranges from 1,550 to 1,650° C.

A series of europium-activated calcium fluoro-oxonitridosilicate powders were prepared by dispersing powders comprising 1.227 mol calcium carbonate, 5.018 mol silicon nitride, 2.456 mol carbon and 0.025 mol europium fluoride in ethanol. The powders were blended in such ratios as to prepare phosphor powders corresponding to the nominal formula $Ca_2Si_5N_8$:Eu,O,F. The slurry was dried and the blended powders were pressed to form cylindrical pellets having a diameter of 1.3 centimeters and a height of 0.75 centimeters. The pellets were sintered in a tungsten boat under nitrogen/hydrogen (95:5) using a high frequency furnace and a temperature profile with a peak temperature of about 1600° C. for about 120 minutes.

A series of europium-activated strontium fluoro-oxonitridosilicate powders were prepared by dispersing powders comprising 1.394 mol strontium carbonate, 5.816 mol silicon nitride, 2.789 mol activated charcoal and 0.058 mol europium fluoride in ethanol. The powders were blended in such ratios as to prepare phosphor powders corresponding to the nominal formula $Sr_2Si_5N_8$:Eu,O,F. The slurry was dried and the blended powders were pressed to form cylindrical pellets having a diameter of 1.3 centimeters and a height of 0.75 centimeters. The pellets were sintered in a tungsten boat under nitrogen/hydrogen (95:5) using a high frequency furnace and a temperature profile with a peak temperature of about 1600° C. for about 120 minutes.

The phosphors $Ea_2Si_5N_8$:Eu,O,F are resistant to heat, light and moisture, because of their halogeno-oxonitridosilicate structure.

The phosphor powders were characterized by powder X-ray diffraction (Cu, Kα-line), which showed that all compounds had formed (results not shown).

The sintered phosphors were excited using a mercury lamp generating ultraviolet light having a peak wavelength of 365 nanometers.

Each phosphor of the europium(II)-activated halogeno-oxonitridosilicate type emits a yellow to red fluorescence when excited by radiation of the UV-A or blue range of the electromagnetic spectrum.

When excited with radiation of a wavelength of 468 nm, these europium(II)-activated halogeno-oxonitridosilicate phosphors are found to give a broad band emission, with a peak wavelength at 625 nm and a tail emission up to 750 nm.

From the excitation spectra, it is also clear that these europium-activated halogeno-oxonitridosilicate phosphors can be excited efficiently with radiation of a wavelength of about 325 nm as well as about 468 nm.

Preferably, the europium(II)-activated halogeno-oxonitridosilicate type phosphors according to the invention may be coated with a thin, uniform protective layer of one or more compounds selected from the group formed by the fluorides and orthophosphates of the elements aluminum, scandium, yttrium, lanthanum gadolinium and lutetium, the oxides of aluminum, yttrium and lanthanum and the nitride of aluminum.

The thickness of the protective layer customarily ranges from 0.001 to 0.2 μm and, thus, is so thin that the layer can be penetrated by the radiation from the radiation source without substantial loss of energy. The coatings of these materials on the phosphor particles can be applied, for example, by deposition from the gas phase using a wet-coating process.

At least two different types of solid state fluorescent materials may be manufactured from the above-mentioned phosphor compounds.

A first type of solid state fluorescent element suitable for use in the present invention is ceramic fluorescent elements, where particles of phosphor compounds, or phosphor precursor compound are compressed and sintered at high temperatures so that they become ceramic, for example by pressing and sintering methods well known in the art.

The ceramic fluorescent elements may then be grinded and polished to obtain a suitable thickness with high accuracy.

A second type of solid state fluorescent element suitable for use in the present invention is polymer dispersed fluorescent element, where phosphor particles are dispersed in a polymer. The polymer should typically be essentially optically clear, and a variety of polymers are known in the LED industry for making LEDs. For example, the polymer may be selected from the group comprising epoxy and silicone resins.

The polymer dispersed fluorescent elements may be manufactured by introducing phosphor particles into a solution of polymer precursors and then causing the solution to polymerize.

The polymer dispersed fluorescent elements may then, after polymerization be grinded and polished to obtain a suitable thickness with high accuracy.

The tolerance with which the thickness of the above mentioned fluorescent elements may be controlled is less than 5% of the thickness, such as less than 3% of the thickness.

For optical coupling of a fluorescent element to a light emitting diodes, an adhesive layer of optically clear elastic or solid material could be arranged between the fluorescent element and the light emitting diode. Preferably, the adhesive material should have a refractive index allowing good coupling of light, typically in the range of from 1.4 to 3.0.

Fluorescent elements suitable for use in the present invention may comprise one phosphor compound or may be a mixture of two or more phosphor compounds.

A mixture of phosphor compounds may comprise two or more different europium(II)-activated halogeno-oxonitridosilicate phosphor compounds of the general formula $Ea_x Si_y N_{2/3+4/3y}:Eu_z O_a X_b$, wherein $1 \leq x \leq 2$; $3 \leq y \leq 7$; $0.001 < z \leq 0.09$, $0.005 < a \leq 0.05$, $0.01 < b \leq 0.3$, Ea is as least one earth alkaline metal chosen from the group comprising calcium, strontium and barium; and X is a least one halogen selected from the group comprising fluorine, chlorine, bromine and iodine.

Alternatively, a mixture of phosphor compounds may comprise one europium(II)-activated halogeno-oxonitridosilicate phosphor compound of the above-mentioned type and an additional phosphor compound, optionally having a different general formula.

Several such additional phosphor compounds are known, and includes, but are not limited to:

blue phosphors (i.e. emitting essentially blue light upon excitation) comprised in the group consisting of $BaMgAl_{10}O_{17}:Eu$, $Ba_5SiO_4(Cl,Br)_6:Eu$, $CaLn_2S_4:Ce$, $(Sr,Ba,Ca)_5(PO_4)_3Cl:Eu$ and $LaSi_3N_5:Ce$;

red phosphors (i.e. emitting essentially red light upon excitation) comprised in the group consisting of $(Ca_{1-x}Sr_x)S:Eu$, wherein $0 \leq x \leq 1$ and $(Sr_{1-x-y}Ba_xCa_y)_{2-z}Si_{5-a}Al_aN_{8-a}O_a:Eu_z$, wherein $0 \leq a < 5$, $0 < x \leq 1$, $0 \leq y \leq 1$ and $0 < z \leq 0.09$; and yellow to green phosphors (i.e. emitting essentially yellow to green light upon excitation) comprised in the group consisting of $(Ba_{1-x}Sr_x)_2SiO_4:Eu$, wherein $0 \leq x \leq 1$, $SrGa_2S_4:Eu$, $SrSi_2N_2O_2:Eu$, $Ln_3Al_5O_{12}:Ce$ and YAG-Ce.

A typical display device of the present invention is illustrated in FIG. 1, showing a display device 100 comprising a plurality of lighting units 101 which optionally are independently addressable. An alternative embodiment, not shown, comprises of a display device as shown in FIG. 1, where the light emitted from the device is mixed and coupled into a light guide, which light guide in turn is arranged to illuminate an area, such as a liquid crystal cell.

As used herein, the term "total light", in the case of a light emitting diode provided with a fluorescent element, refers to the light of the combined emission of (i) the light emitted by the LED not being absorbed by the fluorescent element, and (ii) the light emitted by the excited fluorescent element. Thus, the total light is the light provided by the LED-fluorescent element that would be perceived by an observer.

For an LED provided with a fluorescent element, the light emitted by the LED, which is capable of exciting the fluorescent element, is sometimes herein referred to as the "pump light". Analogous, the "pump wavelength" and "pump color" and refers to the wavelength and color, respectively, of the "pump light".

As used herein, the term "light emitting diode" or "LED" refers to all types of light emitting diodes emitting light in the range from UV-light to IR-light, especially in the UV-visible range. In the context of the present invention, light emitting diodes are taken to also encompass laser light emitting diodes ("LD"). In the context of the present invention, light emitting diodes are taken to encompass inorganic light emitting diodes, organic light emitting diodes (OLEDs) and polymeric light emitting diodes (polyLEDs).

As used herein, the term "bin", in the context of the properties of light emitting diodes, refers to a classification of light emitting diode. Within such a bin, all LEDs emit light having a maximum emission wavelength within a defined wavelength range of for example 5 nm.

As used herein, the term "same color" refers to that two separate light sources emits light, the color of which for a human observer does not differ. For example, this can be defined as the light from the two light sources are within the same McAdam ellipse (see for example, MacAdam, D. L., Visual sensitivities to color differences in daylight, J. Opt. Soc. Am., 32, 247 (1942) and MacAdam D. L., Color Measurement, Heidelberg 1981).

Consequently, the term "different colors" refers to the opposite of "same color", i.e. that light of different colors is not within one and the same McAdam ellipse.

Figure 2:
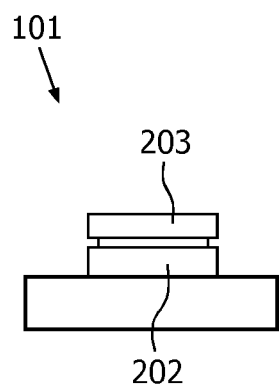
FIG. 2 illustrates in detail one embodiment of a lighting unit of the display device in FIG. 1.

In a first embodiment of the present invention, the lighting units is arranged to provide essentially white light, and one such lighting unit 101 is shown in FIG. 2.

In this embodiment, the lighting unit comprises a blue light emitting LED 202, emitting light in the interval of about 400-480 nm, provided with a solid state fluorescent element 203, also known as a color converter plate (CCP). In this embodiment, the converter plate 203 may be of ceramic type, as disclosed above, or alternatively of polymer dispersed type, also as disclosed above.

The CCP 203 is arranged to absorb part of the blue light emitted by the LED 202, i.e. the pump light. The absorbed pump light excites the fluorescent material in the plate, which then emits light of a yellow color range.

The total light, i.e. the non-absorbed pump light combined with the phosphor-emitted light is perceived as a white light.

The white-light emitting lighting unit according to the invention can advantageously be produced by choosing the composition of the CCP material such that the blue radiation emitted by the blue light emitting diode is converted into complementary wavelength ranges, to form polychromatic white light.

The fluorescent element may comprise a single yellow to red europium activated halogeno-oxonitridosilicate phosphor. Alternatively, the fluorescent element may comprise a blend of phosphors including europium-activated halogeno-oxonitridosilicate phosphor and a second phosphor, for example a yellow to green phosphor selected from the group comprising $(Ba_{1-x}Sr_x)_2SiO_4:Eu$, wherein $0 \leq x \leq 1$, $SrGa_2S_4:Eu$, $SrSi_2N_2O_2:Eu$, $Ln_3Al_5O_{12}:Ce$ and YAG-Ce. Alternatively, the fluorescent element may comprise a blend of three phosphors, i.e. a yellow to red europium activated halogeno-oxonitridosilicate phosphor, a red phosphor selected from the group comprising $(Ca_{1-x}Sr_x)S:Eu$, wherein $0 \leq x \leq 1$ and $(Sr_{1-x-y}Ba_xCa_y)_{2-z}Si_{5-a}Al_aN_{8-a}O_a:Eu_z$, wherein $0 \leq a < 5$, $0 < x \leq 1$, $0 \leq y \leq 1$ and $0 < z \leq 0.09$, and a yellow to green phosphor selected from the group comprising $(Ba_{1-x}Sr_x)_2SiO_4:Eu$, wherein $0 \leq x \leq 1$, $SrGa_2S_4:Eu$, $SrSi_2N_2O_2:Eu$, $Ln_3Al_5O_{12}:Ce$ and YAG-Ce.

As mentioned above, after the production of LEDs, they are divided into bins depending on the maximum wavelength of the emitted light.

The high thickness accuracy with which the CCPs may be manufactured provides several possibilities for the manufacture of display devices of the present invention with low or no color variation.

The total light is a combination of the pump-light and the phosphor-emitted light.

In a first alternative, the LEDs are selected from one bin, i.e. all having a maximum emission wavelength in a narrow range. As the pump-wavelength in this embodiment is homogenous over the device, it is preferable that the thickness of the of the CCPs to be placed on the LEDs are manufactured with a narrow distribution of thicknesses, such that the total light from the LED-CCP also is homogenous over the device.

Preferably, the thickness of the CCPs should not vary more than about 5%, preferably less than about 3% in order to give variations that are not perceivable to an human observer.

In a second alternative, the LEDs are selected from different bins. However, by suitably adapting the thickness of each CCP to the specific LED it is to be arranged on (e.g. one type of color converter plate per bin) the total light from each LED is perceived by the user as having the same color. Thus, the thickness of the of the CCP is used to tune the total color of the LED.

This second alternative provides a display device that can make use of pump-LEDs from many different bins. This may reduce the cost of such displays, as a greater part of all LEDs produced for this purpose may be used.

In an alternative to this first embodiment, a white-light emitting lighting unit according to the invention can advantageously be produced by choosing the luminescent material such that UV radiation emitted by a UV light emitting diode is converted into complementary wavelength ranges, to form dichromatic white light. Typically, a UV-LED emits light in a wavelength range of from 200 to 420 nm.

In this case, the yellow and blue light is produced by means of the luminescent materials. Yellow light is produced by means of the luminescent materials that comprise a europium-activated halogeno-oxonitridosilicate phosphor. Blue light is produced by means of the luminescent materials that comprise a blue phosphor selected from the group comprising $BaMgAl_{10}O_{17}$:Eu, $Ba_5SiO_4(Cl,Br)_6$:Eu, $CaLn_2S_4$:Ce, $(Sr,Ba, Ca)_5(PO_4)_3Cl$:Eu and $LaSi_3N_5$:Ce. Alternatively, the luminescent materials may be a blend of three phosphors, i.e. a yellow to red europium activated halogeno-oxonitridosilicate phosphor, a blue phosphor selected from the group comprising $BaMgAl_{lo}O_{17}$:Eu, $Ba_5SiO_4(Cl,Br)_6$ Eu, $CaLn_2S_4$:Ce, $(Sr,Ba, Ca)_5(PO_4)_3Cl$:Eu and $LaSi_3N_5$:Ce, and a yellow to green phosphor selected from the group comprising $(Ba_{1-x}Sr_x)_2SiO_4$:Eu, wherein $0\leq x \leq 1$, $SrGa_2S_4$:Eu, $SrSi_2N_2O_2$:Eu, $Ln_3Al_5O_{12}$:Ce and YAG:Ce.

Figure 3:
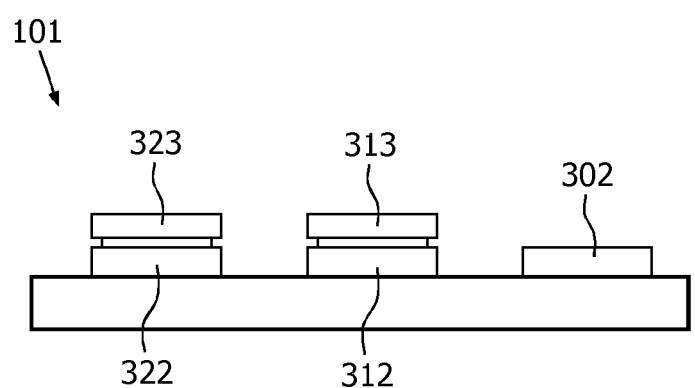
FIG. 3 illustrates in detail another embodiment of a lighting unit of the display device in FIG. 1.

In a second embodiment of the present invention, the lighting units are color variable with the ability to provide white light. Such a lighting unit is shown in FIG. 3, comprising three blue LEDs 302, 312, 322.

The LED 312 is provided with a fluorescent element 313 which converts the blue light emitted by the LED 312 into green light (green CCP). The LED 322 is provided with a fluorescent element 323 which converts the blue light emitted by the LED 322 into red light (red CCP). Thus, together with the LED 302 not being provided with any fluorescent material, this lighting unit forms an RGB-pixel. Each LED in a lighting unit of this kind may be individually controllable to provide a color variable pixel.

If the display device is used as backlight for yet another display or as direct light source, the grouping of red, green and blue LEDs can be different than into pixels to ensure maximum homogeneity in white emission across the display.

Thus, each lighting unit comprises at least one LED of each color (typically red green and blue), but each LED may be part of more than one lighting unit.

As the wavelength range of the total light of an LED provided with a CCP is a combination of the blue pump light and the phosphor converted light, also in this second embodiment the thickness of the fluorescent elements are important.

In this second embodiment, similar options to those presented above in the first embodiment applies.

Thus, for LED-CCPs adapted for providing light of a certain color, (such as red or green) one alternative is to chose the pump-LED from one bin only and provide CCPs having a narrow distribution of thickness, such that the total light from all LEDs of that color is perceives as identical in color.

Another alternative is to as discussed above select the pump-LEDs from different bins, and instead arrange CCPs having a suitable thickness on the LEDs, such that the total light from all LEDs of that color is perceives as identical in color.

As in the first embodiment, the fluorescent material may be in the form of ceramic material or polymer dispersed material. Thus, in a display device according to this second embodiment of the present invention, LEDs of from different bins may be used, still providing a high color homogeneity over the whole device.

An alternative to this second embodiment is to for each lighting unit provide three UV emitting diodes and provide the first diode with a blue emitting fluorescent material, provide the second diode with a green emitting fluorescent material and provide the third diode with a red emitting fluorescent material.

Examples of fluorescent elements for converting blue light into green light include, but are not limited to, elements comprising a europium activated halogeno-oxonitridosilicate phosphor as defined herein. Alternatively, the fluorescent element may comprise a blend of phosphors including an europium-activated halogeno-oxonitridosilicate phosphor and a second phosphor, for example a yellow to green phosphor selected from the group comprising $(Ba_{1-x}Sr_x)_2SiO_4$:Eu, wherein $0\leq x \leq 1$, $SrGa_2S_4$:Eu, $SrSi_2N_2O_2$:Eu, $Ln_3Al_5O_{12}$:Ce and YAG-Ce.

Examples of fluorescent elements for converting blue light into red light include, but are not limited to, elements comprising a europium activated halogeno-oxonitridosilicate phosphor as defined herein. Alternatively, the fluorescent element may comprise a blend of phosphors including an europium-activated halogeno-oxonitridosilicate phosphor and a second phosphor selected from the group comprising $(Ca_{1-x}Sr_x)S$:Eu, wherein $0\leq x \leq 1$ and $(Sr_{1-x-y}Ba_xCa_y)_{2-z}Si_{5-a}Al_aN_{8-a}O_a$:Eu$_z$, wherein $0\leq a<5$, $0<x\leq 1$, $0\leq y \leq 1$ and $0<z\leq 0.09$.

The person skilled in the art realizes that the present invention by no means is limited to the preferred embodiments described above. On the contrary, many modifications and variations are possible within the scope of the appended claims. For example, as will be realized by those skilled in the art, this second embodiment is not limited to the actual colors red, green and blue in order to provide a color variable display device capable of providing white light. The colors red, green and blue are exemplary only, and also other colors, such as, but not limited to yellow and/or cyan can be added to a lighting unit in a display device of the present invention.

Each lighting unit in a display device of the present invention may be encapsulated in a transparent or translucent material, for example encapsulated in a polymer encapsulation. Alternatively, each lighting unit may be covered by a lens. Such a lens may for example be made of glass, plastic or may be a lens cap filled with silicone gel. The encapsulation or lens may comprise diffusing particles, for example, but not limited to zirconium oxide, or air bubbles, for improved mixing of the light, especially for lighting units comprising more than one LED.

The fluorescent material arranged on an LED may be shaped into having desired optical properties.

The fluorescent material arranged on an LED may further include diffusing particles.

There are several different applications for a display device of a plurality of lighting units of the present invention.

A first contemplated use is as a direct view display comprising a dense matrix of lighting units as described above. A direct view color display may for example be accomplished by using the RGB lighting units described above. A direct view monochrome display may for example be accomplished by using the dichromatic white emitting lighting units as described above.

A second contemplated use is as a backlight unit for a liquid crystal display device. Such a back light unit may comprise a matrix of white light emitting lighting units as is shown in FIG. 1, directly illuminating the liquid crystal cell, where the lighting units may be of either the two-color or three color type as described above. Alternatively, a backlight unit may comprise a smaller matrix of lighting units, the light from which is coupled into a wave guide which in turn illuminates the liquid crystal cell.

Thus to summarize, the present invention relates to a display device comprising a plurality of lighting units, each lighting unit comprising at least one light emitting diode being provided with a fluorescent element arranged to absorb at least part of the light emitted by said light emitting diode and emit light of a wavelength range different from that of the absorbed light is provided. The fluorescent element comprises at least one phosphor being an europium(II)-activated halogeno-oxonitridosilicate of the general formula $Ea_xSi_yN_{2/3x+4/3y}:Eu_zO_aX_b$.

The invention claimed is:

1. A display device (100) comprising a plurality of lighting units (101), each lighting unit comprising at least one light emitting diode (202) being provided with a fluorescent element (203) arranged to absorb at least part of the light emitted by said light emitting diode and emit light of a wavelength range different from that of the absorbed light,
said fluorescent element (203) comprising at least one phosphor being an europium(II)-activated halogeno-oxonitridosilicate of the general formula $Ea_xSi_yN_{2/3x+4/3y}:Eu_zO_aX_b$, wherein:
$1 \leq x \leq 2$; $3 \leq y \leq 7$; $0.001 < z \leq 0.09$, $0.005 < a \leq 0.05$, $0.01 < b \leq 0.3$;
Ea is at least one earth alkaline metal chosen from the group of calcium, barium and strontium; and
X is at least one halogen chosen from the group of fluorine, chlorine, bromine and iodine.

2. A display device according to claim 1, wherein said fluorescent element is a ceramic material comprising said at least one phosphor.

3. A display device according to claim 1, wherein said fluorescent element comprises particles of said at least one phosphor dispersed in a polymer matrix.

4. A display device according to claim 1, comprising at least a first diode emitting light of a first color being provided with a first fluorescent element and at least a second diode emitting light of a second color being provided with a second fluorescent element,
wherein said first fluorescent element is of a first thickness, said second fluorescent element is of a second thickness, and
said first and second light emitting diodes provides total light of the same color.

5. A display device according to claim 1, wherein said fluorescent element (203) further comprises at least one additional phosphor.

6. A display device according to claim 5, wherein said additional phosphor is selected from the group consisting of:
blue phosphors comprised in the group consisting of $BaMgAl_{10}O_{17}:Eu$, $Ba_5SiO_4(Cl,Br)_6:Eu$, $CaLn_2S_4:Ce$, $(Sr,Ba,Ca)_5(PO_4)_3Cl:Eu$ and $LaSi_3N_5:Ce$;
red phosphors comprised in the group consisting of $(Ca_{1-x}Sr_x)S:Eu$, wherein $0 \leq x \leq 1$ and $(Sr_{1-x-y}Ba_xCa_y)_{2-z}Si_{5-a}Al_aN_{8-a}O_a:Eu_z$, wherein $0 \leq a < 5$, $0 < x \leq 1$, $0 \leq y \leq 1$ and $0 < z \leq 0.09$; and
yellow to green phosphors comprised in the group consisting of $(Ba_{1-x}Sr_x)_2SiO_4:Eu$, wherein $0 \leq x \leq 1$, $SrGa_2S_4:Eu$, $SrSi_2N_2O_2:Eu$, $Ln_3Al_5O_{12}:Ce$ and YAG-Ce.

7. A display device according to claim 1, wherein said lighting unit (101) comprises at least a first light emitting diode (312) and a second light emitting diode (322) of the same semiconductor material, wherein at least one of said first and second light emitting diodes is provided with a fluorescent element.

8. A display device according to claim 7, wherein said first light emitting diode (312) is provided with a first fluorescent element (313) for providing total light of a first wavelength range; and
said second light emitting diode (322) is provided with a second fluorescent element (323) for providing total light of a second wavelength range.

9. A display device according to claim 1, wherein said fluorescent element(s) comprises light scattering portions.

10. A backlight unit for a liquid crystal display device, comprising a display device according to claim 1.

11. A liquid crystal display device comprising a backlight unit according to claim 10.

* * * * *